May 10, 1960 W. SHOCKLEY 2,936,425

SEMICONDUCTOR AMPLIFYING DEVICE

Filed March 18, 1957

WILLIAM SHOCKLEY
INVENTOR.

BY [signature]
ATTORNEYS

United States Patent Office 2,936,425

Patented May 10, 1960

2,936,425

SEMICONDUCTOR AMPLIFYING DEVICE

William Shockley, Los Altos, Calif., assignor to Shockley Transistor Corporation, Palo Alto, Calif., a corporation of California Application March 18, 1957, Serial No. 646,654

8 Claims. (Cl. 330—39)

This invention relates generally to a semiconductor amplifying device.

It is a general object of the present invention to provide an amplifying device which operates by secondary generation of carriers.

It is another object of the present invention to provide a semiconductor amplifying device having two regions of semiconductive material of opposite conductivity type forming a junction.

It is another object of the present invention to provide a semiconductor amplifying device having regions of opposite conductivity type forming a junction in which secondary carriers generated by the signal flowing in one region fall across the junction to the other region which acts as a collector.

It is still another object of the present invention to provide a semiconductor amplifying device in which the signal to be amplified causes the flow of carriers in a generating region, said carriers producing secondary carriers, by avalanche or other secondary processes, which fall across a junction to a collector.

These and other objects of the invention will become more clearly apparent from the following description read in conjunction with the accompanying drawing.

Referring to the drawing.

Figures 1, 2, 3, 4, 5:
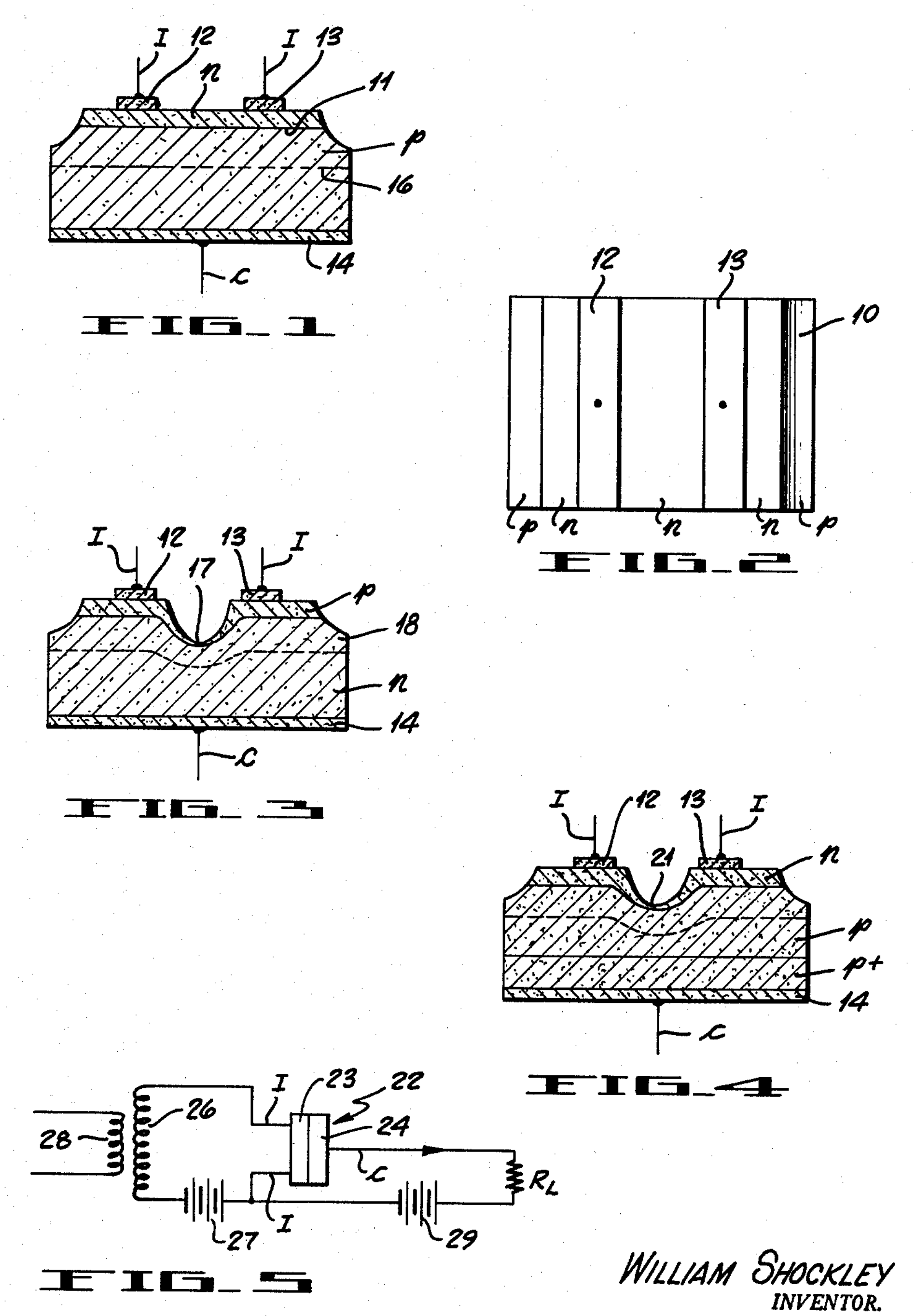
Figure 1 shows in section an illustrative embodiment of the invention.
Figure 2 is a plan view of the semiconductor amplifier of Figure 1.
Figure 3 is a sectional view showing another illustrative embodiment of the invention.
Figure 4 shows in section still another illustrative embodiment of the invention.
Figure 5 shows one type of circuit in which the invention may be employed.

Referring to Figures 1 and 2, an illustrative embodiment of the invention is shown. The amplifying device shown comprises a p-type block of semiconductive material of one conductivity type, for example, p-type, having a layer of semiconductive material of opposite conductivity type, for example, n-type, on one face thereof and forming a junction 11 therewith. Ohmic contact is made to the block which serves as a collector of carriers. A pair of spaced ohmic contacts 12 and 13 provides means for applying an electric field to the operating region of the upper layer. The spacing between the terminals should be such that a high electric field exists between the same whereby carriers flowing will cause secondary generation. The secondary generation may be either by a direct ionization process or by production of heat.

In Figure 1, an n-type layer includes the operating region. Electrons flowing in this layer between the terminals 12 and 13 gain enough energy from the applied electric field to produce holes by the avalanche or other secondary process in the operating region between the terminals. These holes (carriers) are swept across the junction to the p-type layer which acts as a collector.

Voltage and current gain may thus occur depending upon the load applied to the device.

The device may, for example, include p-type and n-type germanium forming a junction 11. The device may be formed by diffusion or other well-known techniques. Typically, the thickness of the n-type layer would be in the order of $10^{-4}$ cm. The input contacts 12 and 13 and collector contact 14 are ohmic contacts formed by techniques well known in the art. The length of the secondary generating region, between the terminals 12 and 13, is typically in the order of one to twenty microns ($10^{-4}$ cm. long). For the direct ionization process, the layer should be short. With a layer one micron long and with voltages in the order of 20 volts applied, the field is of the order of $2\times10^5$ volts per cm. With fields in the order of 2 to $3\times10^5$ volts/cm. there is strong secondary generation in germanium in the order of $10^4$ to $10^5$ carriers per cm. Thus, an increase of less than 30 volts will generate secondary carriers of many times the input carriers. The secondary carriers fall across to the collector to produce an enhanced current flow.

The transit time of electrons is $10^{-4}$/v. where v. is in the order of $10^7$ cm. per second. Thus, the transit time is $10^{-11}$ seconds. Hence, the input circuit may be operated at relatively high frequencies.

The transit time of the secondary carriers may be small if the space charge layer which is indicated by the dotted line 16 is not too wide. It is well known that the space charge layer may be controlled by the voltages applied to the device and by tailoring the concentration of carriers in the collector and secondary generating layer. Thus, the transit time of secondary carriers may be controlled to give high frequency operation.

Preferably, the generating region is very thin whereby the secondary carriers which are generated fall into the field at the junction and are swept across the junction to the collector. With relatively thin layers, the secondary carriers do not have time to be trapped in recombination centers and, therefore, a large percentage of the carriers find their way across the junction to produce a current in the output circuit of the device.

In Figure 3 another embodiment of the invention is shown. The embodiment of Figure 3 includes a secondary generation region 17 which is relatively thin whereby a majority of the secondary carriers generated are swept across the junction 18 to the collector. The device illustrated comprises an n-type collector with a p-type layer formed thereon. The p-type layer has relatively thick portions to which contacts 12 and 13 are made and a relatively thin portion 17 which acts as the secondary generation region. The device of Figure 3 is formed by starting with an n-type block and then diffusing thereon a p-type layer. Subsequent to the diffusion, a groove is cut in the p-type layer which extends through the layer into the n-type block. A subsequent diffusion in the presence of acceptors serves to form a relatively thin p-type layer 17 at the bottom of the grooves which has its side portions merging with the relatively thick portions to which the contacts 12 and 13 are made. The impurity concentration of the thick ribs and of the relatively thin operating regions may be accurately controlled. Subsequent to the two diffusions, the p-type skin which formed on the device is removed. Regions 17 having thicknesses of the order of one micron or less may be easily formed while the regions to which contacts are made may have thicknesses of 10 microns or more. The length of the generating layer 17 may be made as small as desired by controlling the penetration of the groove into the n-type layer. Thus, typically, regions having lengths of 20 microns or less may be easily made.

Operation of the device of Figure 3 is similar to that of Figure 1. Secondary carriers (electrons) are generated by holes traveling in the relatively thin secondary generating region. These carriers fall across the junction 18 and are collected by the n-type layer.

The second frequency limitation of the device is of the thickness of the space charge layer through which the secondary carriers must fall to reach the collector. Referring to Figure 4, the device illustrated is similar to that of Figure 3 but includes an additional region having a high carrier concentraiton which serves to limit the width of the space charge layer.

The device illustrated comprises a p-type collector which has two regions, a region adjacent the collector terminal which has a high impurity concentration, indicated by a $p+$, and a p-type region adjacent thereto. An n-type layer is formed on the p-type surface by diffusion or other techniques. A groove is formed, as previously described, which extends into the p-type layer. A subsequent diffusion in the presence of donor impurity serves to form a relatively thin operating layer 21. As previously described, the length of the layer may be controlled by the amount of penetration into the p-type layer and by the sharpness of the groove. The thickness is controlled by controlling the diffusion time.

The device of Figure 4 typically has a $p+$ region having carrier concentration of the order of $10^{20}$ cm.$^{-3}$ and a $p$ region having concentration of the order of $10^{14}$ cm.$^{-3}$. The n-type layer in the operating region may be typically one micron thick and ten microns long whereby high frequency operation may be easily achieved.

Referring to Figure 5, a circuit in which the various embodiments of the invention may be employed is illustrated. It is, of course, to be understood that the circuit is illustrative only and that other circuits may be advantageously employed. The device is shown schematically as a block 22 which includes an operating region 23 and a collector region 24. Connections thereto are keyed to the embodiments illustrated by the input letters I and the collector letters C. Connected across the input terminals is the secondary 26 of an input transformer. In series with the winding is a suitable bias voltage source 27 which serves to provide a field between the input terminals which causes secondary generation, as previously described. Input to the device is through the primary 28 of the transformer.

The output of the device is shown connected to a load $R_L$. A suitable bias voltage source 29 is connected in series with the load and serves to bias the junction in a reverse direction. The battery 29 is shown having a polarity suitable for an n-type generating layer and p-type collector layer. For opposite conductivity types the polarity of the battery is reversed. The device serves as a current or voltage amplifier depending upon the load $R_L$. For a relatively high impedance load, the device will serve as a voltage amplifier providing an output voltage which is many times greater than the input voltage. On the other hand, with a relatively low impedance load, the output current will have a magnitude which is many tmies greater than the input current.

Thus, it is seen that an improved amplifier is provided. The amplifier may be easily constructed and is suitable for high frequency operation.

I claim:

1. A semiconductor amplifying device comprising within a single body of semiconductive material first and second regions of opposite conductivity types separated by a junction, said first region being a region of secondary generation and having two spaced contacts separated by a relatively high resistance portion which contributes more than half the resistance between the contacts, first means for producing secondary generation of carriers in the portion of said region of secondary generation between the contacts, said first means comprising means for applying a signal voltage between said contacts, and second means for causing said generated carriers to fall across the junction and to be collected by said collector region, said second means comprising means for applying a reverse bias voltage to said junction, the thickness of said high resistance portion and adjacent portions of said first region into which minority carries drift under the influence of said signal voltage being less than the average distance that a minority carrier diffuses before recombining with a majority carrier in said first region under the influence of the electric fields produced by said signal and said reverse bias voltage.

2. A semiconductor amplifying device comprising a first region of semiconductive material of one conductivity type, a second region of semi-conductive material of opposite conductivity type forming a junction therewith, first means for producing secondary generation of carriers in a portion of said second region, said first means comprising means for applying an electric field to said predetermined portion, and second means for causing said generated carriers to fall across said junction and to be collected by said first region, said second means comprising means for applying a reverse bias voltage to the junction.

3. A semiconductor amplifying device comprising a first region of semiconductive material of one conductivity type forming a collector region, a second region of semiconductive material of opposite conductivity type, said second region including relatively thick rib portions and a relatively thin operating region forming a junction with the first region, first means for producing secondary generation of carriers in said operating region, said first means comprising means for applying a signal between said rib portions, and second means for causing said generated carriers to fall across the junction and to be collected by the collector region, said second means comprising a means for applying a reverse bias voltage to said junction.

4. A semiconductor amplifying device comprising a first region of semiconductive material of one conductivity type forming a collector region, a region of secondary generation of semiconductive material of opposite conductivity type forming a junction with said first region, first means for producing secondary generation of minority carriers in a portion of said region of secondary generation, said first means comprising means for applying a signal to said second portion to create a relatively high electric field in said portion, and second means for causing said generated minority carriers to fall across said junction and be collected by said collector region, said second means comprising means for applying a reverse bias voltage to said junction.

5. A semiconductor amplifying device comprising a first region of semiconductive material of one conductivity type forming a collector region, a region of secondary generation of semiconductive material of opposite conductivity type forming a junction therewith, first means for producing secondary generation of carriers in a portion of said region of secondary generation, said first means comprising means for applying a signal to said portion to create a relatively high field in said portion of the region of secondary generation whereby minority carriers are generated in said portion, and second means for causing said generated carriers to fall across said junction and be collected by the collector region, said second means comprising means for applying a reverse bias voltage to said junction to thereby form a space charge region at the junction.

6. A semiconductor amplifying device comprising a first region of semiconductive material of one conductivity type forming a collector region, a region of secondary generation of semiconductive material of opposite conductivity type forming a junction therewith, a pair of spaced contacts formed on said region of secondary generation, first means for producing secondary generation of carriers in a portion of said region of secondary generation between the contacts, said first means comprising means for applying a signal between said contacts, and second means for causing said generated carriers to fall across said junction and to be collected by said collector region, said second means comprising means for applying a reverse bias voltage to said junction.

7. A semiconductor amplifying device comprising a first region of semiconductive material of one conductivity type forming a collector region, a region of secondary generation of semiconductive material of opposite conductivity type forming a junction therewith, a pair of spaced contacts formed on said region of secondary generation, first means for producing secondary generation of carriers in the portion of said region of secondary generation between the contacts, said first means comprising means for applying a signal between said contacts, and second means for causing said generated carriers to fall across said junction and to be collected by said collector region, said second means comprising means for applying a reverse bias voltage to said junction.

8. A semiconductor amplifying device comprising a first region of semiconductive material of one conductivity type forming a collector region, a second region of semiconductive material of opposite conductivity type, said second region including relatively thick rib portions and a relatively thin operating region forming a junction with said first region, the thickness of said relatively thin operating region being less than the diffusion length of minority carriers, a pair of spaced contacts formed on said rib portions, first means for producing secondary generation carriers in the portion of the second region between the contacts, said first means comprising means for applying a signal between said contacts, and second means for causing the generated carriers to fall across said junction and be collected by said collector region, said second means comprising a means for applying a reverse bias voltage to said junction.

References Cited in the file of this patent

UNITED STATES PATENTS

| | | |
|---|---|---|
| 1,900,018 | Lilienfeld | Mar. 7, 1933 |
| 2,666,814 | Shockley | Jan. 19, 1954 |
| 2,791,758 | Looney | May 7, 1957 |
| 2,805,347 | Haynes et al. | Sept. 3, 1957 |